(12) United States Patent
Won et al.

(10) Patent No.: US 7,297,591 B2
(45) Date of Patent: Nov. 20, 2007

(54) METHOD FOR MANUFACTURING CAPACITOR OF SEMICONDUCTOR DEVICE

(75) Inventors: Seok-Jun Won, Seoul (KR);
Myong-geun Yoon, Seoul (KR);
Yong-Kuk Jeong, Seoul (KR); Dae-jin Kwon, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 490 days.

(21) Appl. No.: 10/748,308

(22) Filed: Dec. 29, 2003

(65) Prior Publication Data

US 2004/0141390 A1    Jul. 22, 2004

(30) Foreign Application Priority Data

Dec. 30, 2002   (KR) ................. 10-2002-0087241

(51) Int. Cl.
*H01L 21/8242* (2006.01)
(52) U.S. Cl. .............. 438/253; 438/387; 257/310
(58) Field of Classification Search ........... 257/310, 257/300, 303, 306; 438/201, 211
See application file for complete search history.

(56) References Cited

U.S. PATENT DOCUMENTS 6,576,053 B1 * 6/2003 Kim et al. ................. 117/89

2003/0096473 A1 * 5/2003 Shih et al. ................. 438/240
2004/0067657 A1 * 4/2004 Perng et al. ............... 438/745

FOREIGN PATENT DOCUMENTS

KR      2001-0065182       7/2001

OTHER PUBLICATIONS

English language abstract of Korean Publication No. 2001-0065182.

* cited by examiner

*Primary Examiner*—David Nelms
*Assistant Examiner*—Thinh T Nguyen
(74) *Attorney, Agent, or Firm*—Marger Johnson & McCollom, P.C.

(57) ABSTRACT

Provided is a capacitor of a semiconductor device. The capacitor includes a capacitor lower electrode disposed on a semiconductor substrate. A first dielectric layer comprising aluminum oxide ($Al_2O_3$) is disposed on the capacitor lower electrode. A second dielectric layer comprising a material having a higher dielectric constant than that of aluminum oxide is disposed on the first dielectric layer. A third dielectric layer comprising aluminum oxide is disposed on the second dielectric layer. A capacitor upper electrode is disposed on the third dielectric layer. The capacitor of the present invention can improve electrical properties. Thus, power consumption can be reduced and capacitance per unit area is high enough to achieve high integration.

14 Claims, 9 Drawing Sheets

METHOD FOR MANUFACTURING CAPACITOR OF SEMICONDUCTOR DEVICE

BACKGROUND OF THE INVENTION

This application claims priority from Korean Patent Application No. 2002-87241 filed on Dec. 30, 2002, in the Korean Intellectual Property Office, the contents of which are incorporated herein in their entirety by reference.

1. Field of the Invention

The present invention relates to a semiconductor device, and more particularly, to a capacitor of a semiconductor device and a method for manufacturing the same.

2. Description of the Related Art

As the integration density of semiconductor memory devices increases, the space taken up by a memory cell area typically decreases. A decrease in cell capacitance is typically a serious obstacle in increasing the integration of dynamic random access memory (DRAM) devices having storage capacitors.

In a high voltage (10V or higher) device such as Liquid Crystal Device (LCD) Drive Integrated Circuit (IC) or LDI, a decrease in the cell capacitance raises the boosting frequency to increase power dissipation, thereby making it difficult to scale down the entire chip size. For memory devices, a decrease in the cell capacitance not only lowers the ability to read a memory cell and increases a soft error rate, but it also hinders the operation of the device at low voltages and causes excessive power consumption during the operation of the device. Therefore, a method for increasing cell capacitance needs to be developed for the manufacture of a highly integrated semiconductor memory device.

Generally, dielectric properties of the cell capacitance can be evaluated by the equivalent oxide thickness (Toxeq) and the leakage current density. The Toxeq is a value obtained by converting the thickness of a dielectric layer formed of a material other than a silicon oxide substance into the thickness of a dielectric layer formed of a silicon oxide substance. As the value of the Toxeq becomes smaller, the capacitance increases. Also, it is preferable that the leakage current density has a small value in order to improve the electrical properties of a capacitor.

In a conventional method, to increase the cell capacitance, a dielectric layer is formed of a combination of a silicon oxide layer ($SiO_2$, hereinafter represented as 'O') and a silicon nitride layer ($Si_3N_4$, hereinafter represented as 'N'), for example, an NO, ON, or ONO layer. However, because the silicon oxide and silicon nitride layers have low dielectric constants, this method is limited in improving the cell capacitance.

Thus, research is being done on methods in which a silicon nitride layer or a silicon oxide layer is replaced by a high dielectric layer having a high dielectric constant for the dielectric layer of a capacitor. Accordingly, various metal oxides having high dielectric constants are potentially strong candidates for this new capacitor dielectric layer material.

SUMMARY OF THE INVENTION

The present invention provides a capacitor of a semiconductor device having a large capacitance per unit area, by which leakage current can be inhibited to reduce power dissipation and the size can be scaled down to achieve high integration. A method for manufacturing the same is also provided.

In accordance with an aspect of the present invention, a capacitor of a semiconductor device includes a capacitor lower electrode disposed on a semiconductor substrate. A first dielectric layer comprising aluminum oxide ($Al_2O_3$) is disposed on the capacitor lower electrode. A second dielectric layer comprising a material having a higher dielectric constant than that of aluminum oxide is disposed on the first dielectric layer. A third dielectric layer comprising aluminum oxide is disposed on the second dielectric layer. A capacitor upper electrode is disposed on the third dielectric layer.

Preferably, a capacitor dielectric layer includes the first and third dielectric layers formed of aluminum oxide, which exhibits a large band gap and conforms with a tunneling mechanism, and the second dielectric layer formed of a high k-dielectric material, which has a higher dielectric constant than that of aluminum oxide and can serve as a voltage distributor to the first and third dielectric layers.

In an embodiment of the present invention, the second dielectric layer is preferably formed of a material having a dielectric constant of 20 or higher. For example, the second dielectric layer may be formed of one selected from the group consisting of a $Ta_2O_5$ layer, a Ti-doped $Ta_2O_5$ layer, a TaOxNy layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$(BST) layer, a $PbTiO_3$ layer, a Pb(Zr, Ti)$O_3$(PZT) layer, a $SrBi_2Ta_2O_9$(SBT) layer, a (Pb, La)(Zr, Ti)$O_3$ layer, and a $BaTiO_3$(BTO) layer, and combinations thereof. The second dielectric layer is preferably thicker than the first dielectric layer or the third dielectric layer and may range from about 100 Å to about 1000 Å.

The thickness of the first dielectric layer or the third dielectric layer may range from about 30 Å to about 300 Å. The capacitor lower electrode and the capacitor upper electrode may be formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and combinations thereof.

In accordance with another aspect of the present invention, a method for manufacturing a capacitor of a semiconductor device is provided. The method includes forming a lower electrode of a capacitor on a semiconductor substrate. Next, a first dielectric layer comprising aluminum oxide is formed on the capacitor lower electrode, and then a second dielectric layer comprising a material having a higher dielectric constant than aluminum oxide is formed on the first dielectric layer. Afterwards, a third dielectric layer comprising aluminum oxide is formed on the second dielectric layer. Finally, a capacitor upper electrode is formed on the third dielectric layer.

In an embodiment of the present invention, the second dielectric layer is preferably formed of a material having a dielectric constant of 20 or higher. For example, the second dielectric layer may be formed of one selected from the group consisting of a $Ta_2O_5$ layer, a Ti-doped $Ta_2O_5$ layer, a TaOxNy layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$(BST) layer, a $PbTiO_3$ layer, a Pb(Zr, Ti)$O_3$(PZT) layer, a $SrBi_2Ta_2O_9$(SBT) layer, a (Pb, La)(Zr, Ti)$O_3$ layer, and a $BaTiO_3$(BTO) layer, and any combination thereof. The second dielectric layer is preferably formed to be thicker than the first dielectric layer or the third dielectric layer and may be formed to a thickness of 100 Å to 1000 Å.

In this embodiment of the present invention, the method may further comprise performing a thermal treatment on the second dielectric layer at a temperature of about 300° C. to about 500° C. after forming the second dielectric layer. The thermal treatment may be carried out in an atmosphere containing oxygen, such as, for example, in an atmosphere of $O_3$ gas, $O_2$ plasma gas, or $N_2O$ plasma gas.

In this embodiment of the present invention, the first dielectric layer or the third dielectric layer may be formed to a thickness of about 30 Å to about 300 Å and is preferably formed using a gas containing oxygen (O) without hydrogen (H) as a reactant gas. For instance, the reactant gas may include $O_3$ gas or $O_2$ plasma gas.

In this embodiment of the present invention, the capacitor lower electrode or the capacitor upper electrode may be formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof. The capacitor lower electrode or the capacitor upper electrode is preferably formed at a temperature of about 25° C. to about 500° C. using physical vapor deposition (PVD), atomic layer deposition (ALD), or metal organic chemical vapor deposition (MOCVD).

BRIEF DESCRIPTION OF THE DRAWINGS

The above object and advantages of the present invention will become more apparent by describing in detail embodiments thereof with reference to the attached drawings in which.

DETAILED DESCRIPTION OF THE INVENTION

Figure 1:
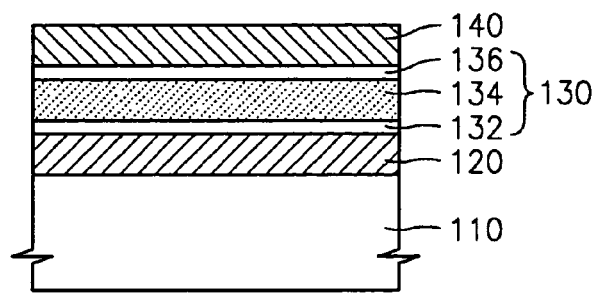
FIG. 1 is a schematic cross-sectional view of a capacitor of a semiconductor device including capacitor electrodes and a dielectric layer according to an embodiment of the present invention.

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

FIG. 1 is a schematic cross-sectional view of a capacitor of a semiconductor including capacitor electrodes and a dielectric layer according to the present invention.

Referring to FIG. 1, a capacitor, including a capacitor lower electrode 120, a dielectric layer 130, and a capacitor upper electrode 140, is formed on a substrate 110. Here, the substrate 110 may be a silicon wafer or a predetermined material layer formed thereon. In the drawings, the capacitor is formed on a substrate for purposes of simplicity. However, the embodiment of the present invention can be also applied to a capacitor formed in a silicon wafer or a capacitor formed in a predetermined material layer.

Also, the embodiment of the present invention is applicable irrespective of the shape of an IC capacitor. The present invention can be applied to a 3-dimensional capacitor, such as a cylinder type, a pin type, or a stack type capacitor, in addition to a capacitor in which the dielectric layer 130 is planarly formed between the conductors 120 and 140 as illustrated in FIG. 1. Further, the present invention can be applied to not only a capacitor of an LDI device operating at a high voltage but also a capacitor of a DRAM device.

The capacitor lower electrode 120 may be formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof. Likewise, the capacitor upper electrode 140 may be formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof. However, the capacitor upper electrode 140 and the capacitor lower electrode 120 may be formed of different materials.

The dielectric layer 130 includes a first dielectric layer 132 formed of an AlO layer, a second dielectric layer 134 formed of a material having a higher dielectric constant than AlO, and a third dielectric layer 136 formed of an AlO layer. The thickness of the first dielectric layer 132 and the third dielectric layer 136 is preferably about 30 Å to about 300 Å. The AlO layers 132 and 136 exhibit a large band gap and show low temperature dependency due to tunneling mechanism.

The second dielectric layer 134 is preferably formed of a material having a high dielectric constant of 20 or higher. This allows the second dielectric layer 134 to serve as a voltage distributor to the first dielectric layer 132 and the third dielectric layer 136. That is, the second dielectric layer 134 helps to distribute a high voltage to the first dielectric layer 132 and the third dielectric layer 136. For this reason, the second dielectric layer 134 is preferably thicker than the first dielectric layer 132 or the third dielectric layer 134. The thickness of the second dielectric layer 134 may range from about 100 Å to about 1000 Å.

The second dielectric layer 134 may be formed of a material having a high leakage current. That is, the second dielectric layer 134 is preferably formed of a material, in which the equivalent oxide thickness (Toxeq) varies with the thickness within a small range. The second dielectric layer 134 may be formed of one selected from the group consisting of a $Ta_2O_5$ layer, a Ti-doped $Ta_2O_5$ layer, a $TaO_xN_y$ layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$(BST) layer, a $PbTiO_3$ layer, a Pb(Zr, Ti)$O_3$(PZT) layer, a $SrBi_2Ta_2O_9$(SBT) layer, (Pb, La)(Zr, Ti)$O_3$ layer, and a $BaTiO_3$(BTO) layer, and combinations thereof.

FIGS. 2 through 6 are various graphs showing properties of the capacitor according to the embodiment of the present invention.

Figure 2:
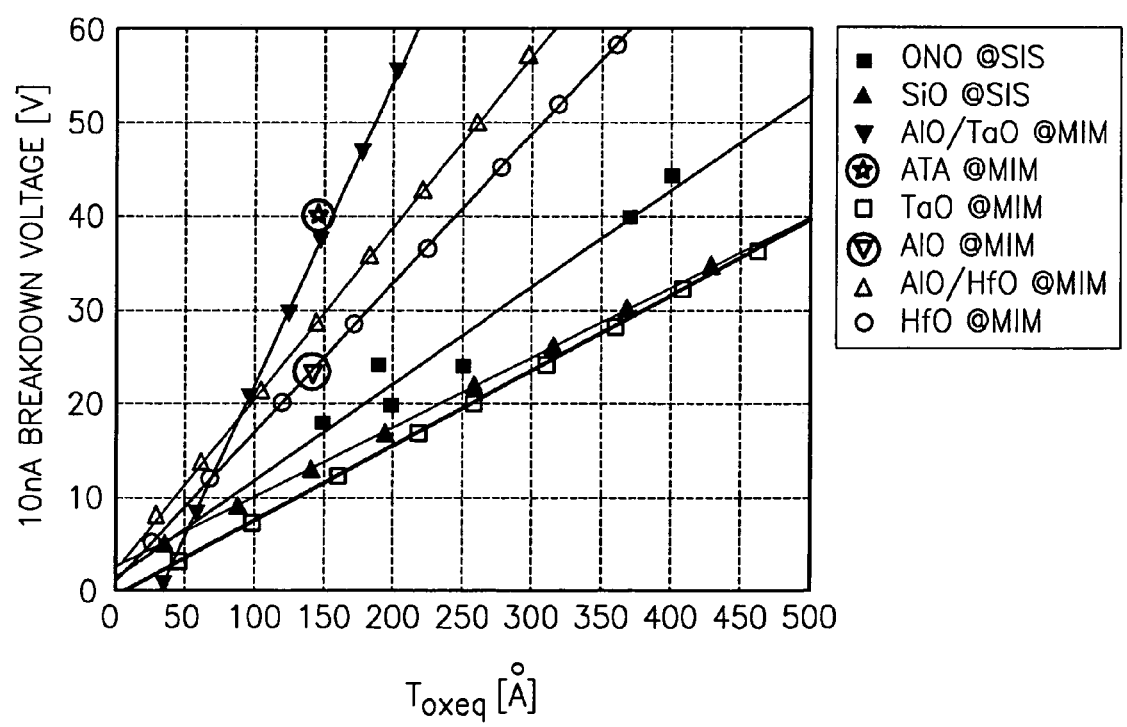
FIG. 2 is a graph showing comparison results of breakdown voltages having a leakage current of 10 nA with respect to various dielectric layers.

FIG. 2 illustrates breakdown voltages having a leakage current of 10 nA with respect to various capacitors and dielectric layers. In FIG. 2, when a capacitor is formed of a polysilicon layer-dielectric layer-polysilicon layer (hereinafter, referred to as 'SIS'), a dielectric layer is one of an ONO layer and a silicon oxide layer. Also, when a capacitor is formed of a metal (or a conductive metal oxide or a conductive metal nitride)-dielectric layer-metal (hereinafter, referred to as 'MIM'), a dielectric layer is one of an AlO/TaO layer, an AlO/TaO/AlO layer (hereinafter, referred to as 'ATA'), a TaO layer, an AlO layer, an AlO/HfO layer, and a HfO layer.

As illustrated in FIG. 2, the dielectric layer 130 formed of a multiple layer such as the AlO/TaO layer, the AlO/HfO layer, and the ATA layer rather than a single layer such as the TaO layer, the AlO layer, and the HfO layer, show superior electrical properties in respect to the breakdown voltage of 10 nA under the same Toxeq.

Therefore, it is preferable that a dielectric layer having a high dielectric constant such as TaO and HfO is formed thicker than other dielectric layers to act as a voltage distributor for reducing the voltage of the AlO layer, and the AlO layer having conductibility by a tunneling mechanism is used to prevent the leakage current.

Figure 3:
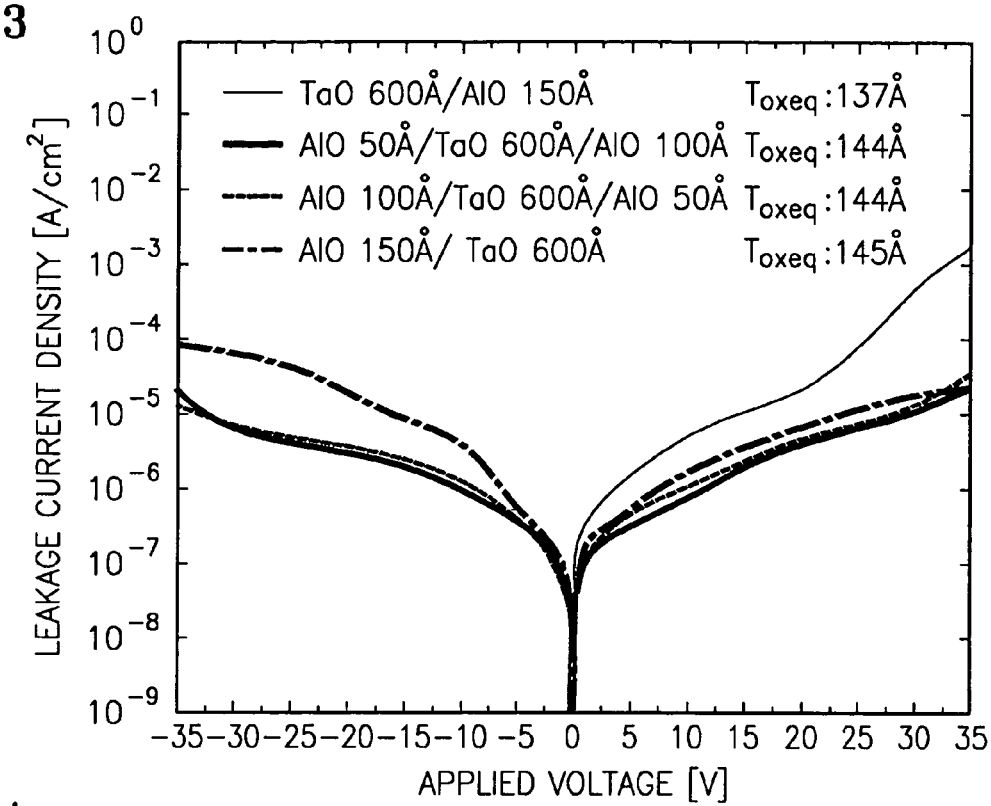
FIG. 3 is a graph showing comparison results of a leakage current characteristic between a capacitor including an $Al_2O_3/Ta_2O_5/AlO$ dielectric layer (hereinafter, $Al_2O_3$ will be referred to as 'AlO' and $Ta_2O_5$ will be referred to as 'TaO') according to the embodiment of the present invention and a capacitor including an AlO/TaO dielectric layer.

FIG. 3 illustrates leakage current characteristics of the capacitor including the ATA layer according to the embodiment of the present invention and the capacitor including the AlO/TaO layer. FIG. 3 illustrates comparison results between a double-layer structure such as an AlO(150 Å)/TaO(600 Å) layer and a TaO(600 Å)/AlO(150 Å) layer, a triple-layer structure such as an AlO(50 Å)/TaO(600 Å)/AlO(100 Å) layer, and an AlO(100 Å)/TaO(600 Å)/AlO (50 Å) layer, in which upper and lower electrodes are formed to different thicknesses, among combinations of AlO and TaO. Referring to FIG. 3, the triple-layer structure such as the ATA layer is superior to the double-layer structure in respect to a balance of the leakage current at a positive voltage and a negative voltage.

Figure 4:
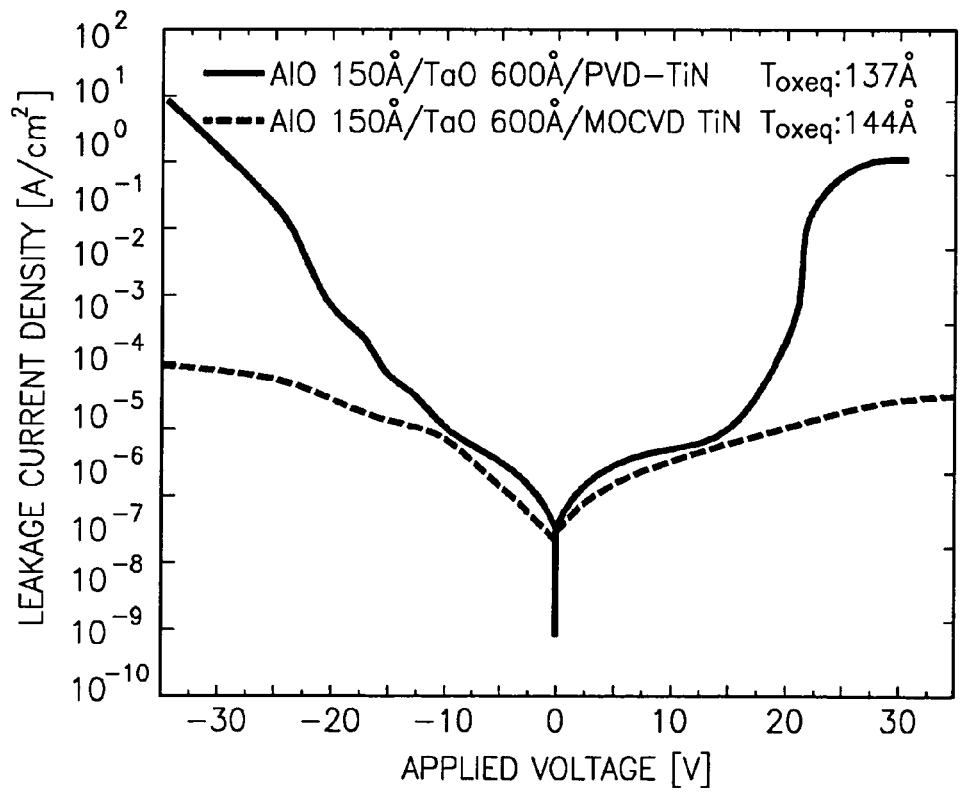
FIG. 4 is a graph showing comparison results of the leakage current density based on method of depositing a capacitor upper electrode in the AlO/TaO structure.
Figure 5:
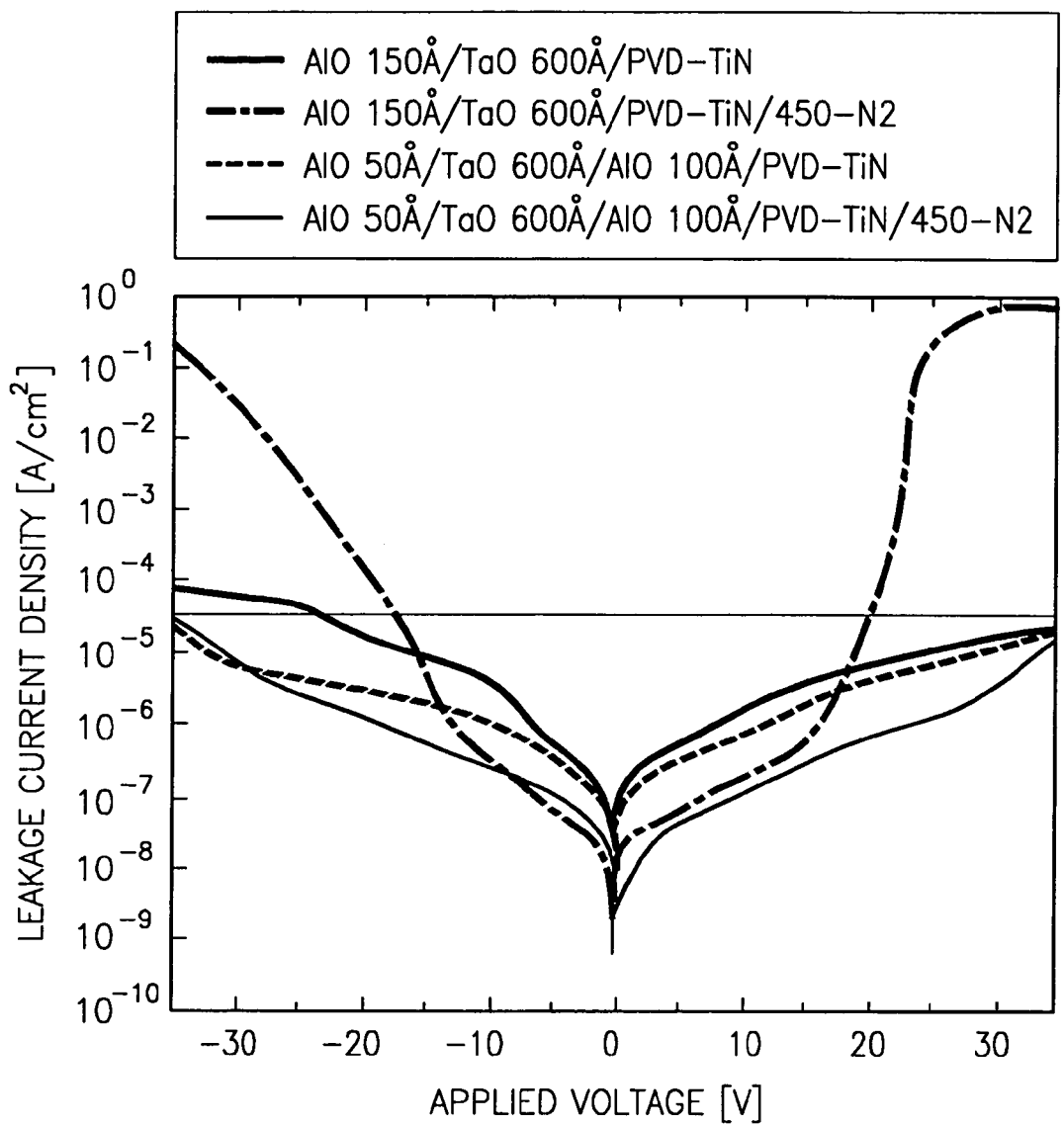
FIG. 5 is a graph showing comparison results of the leakage current density depending on whether or not a thermal treatment is conducted at 450° C. after forming the capacitor upper electrode using PVD.

FIG. 4 illustrates a value of the leakage current density based on a method of depositing a capacitor upper electrode in the AlO(150 Å)/TaO(600 Å) structure. FIG. 5 illustrates values of the leakage current density depending on whether or not a thermal treatment is conducted at about 450° C. after forming the capacitor upper electrode using PVD.

Referring to FIG. 4, a capacitor upper electrode is formed of TiN by two different methods. Firstly, the MOCVD is carried out using a C-based metal organic source gas at about 400° C. Secondly, a capacitor upper electrode is formed by sputtering, one of the PVD processes, using a source gas without carbon at about 200° C.

In comparing the two methods, there is little difference between them at low voltages. However, an early breakdown is caused when a TiN capacitor upper electrode is formed using MOCVD at a high voltage.

Referring to FIG. 5, while a capacitor dielectric layer is formed of the AlO (150 Å)/TaO(600 Å), a capacitor upper electrode is formed of TiN, as in FIG. 4. Here, even if MOCVD is replaced by PVD, when a thermal treatment is further performed at about 450° C. in an $N_2$ atmosphere, the leakage current characteristic of the capacitor is degraded. Accordingly, it can be seen that the early breakdown, caused during the capacitor upper electrode formation using MOCVD, results from a process temperature of about 400° C. rather than the C-based source gas.

In other words, even if a capacitor upper electrode is formed of TiN and then thermally treated in a nitrogen atmosphere at about 450° C., the leakage current characteristic of the capacitor does not degrade when a capacitor dielectric layer has the triple-layer structure of an ATA(AlO (50 Å)/TaO(600 Å)/AlO(100 Å) layer. Rather, in the ATA structure, a current is lowered at a base level.

Therefore, when the dielectric layer has the double-layer structure such as the AlO/TaO layer or the TaO/AlO layer, and the capacitor upper electrode is formed and then thermally treated at a high temperature, TiN and TaO, which form the capacitor upper electrode, react with each other, or oxygen atoms existing in the TaO layer move to the TiN layer. As a result, the TaO layer lacks oxygen, thus increasing the leakage current. To alleviate this type of oxygen shortage in the TaO layer during the high-temperature thermal treatment, in the present invention, another AlO layer is preferably disposed between the TaO layer and the electrode to prevent a direct contact therebetween.

Figure 6:
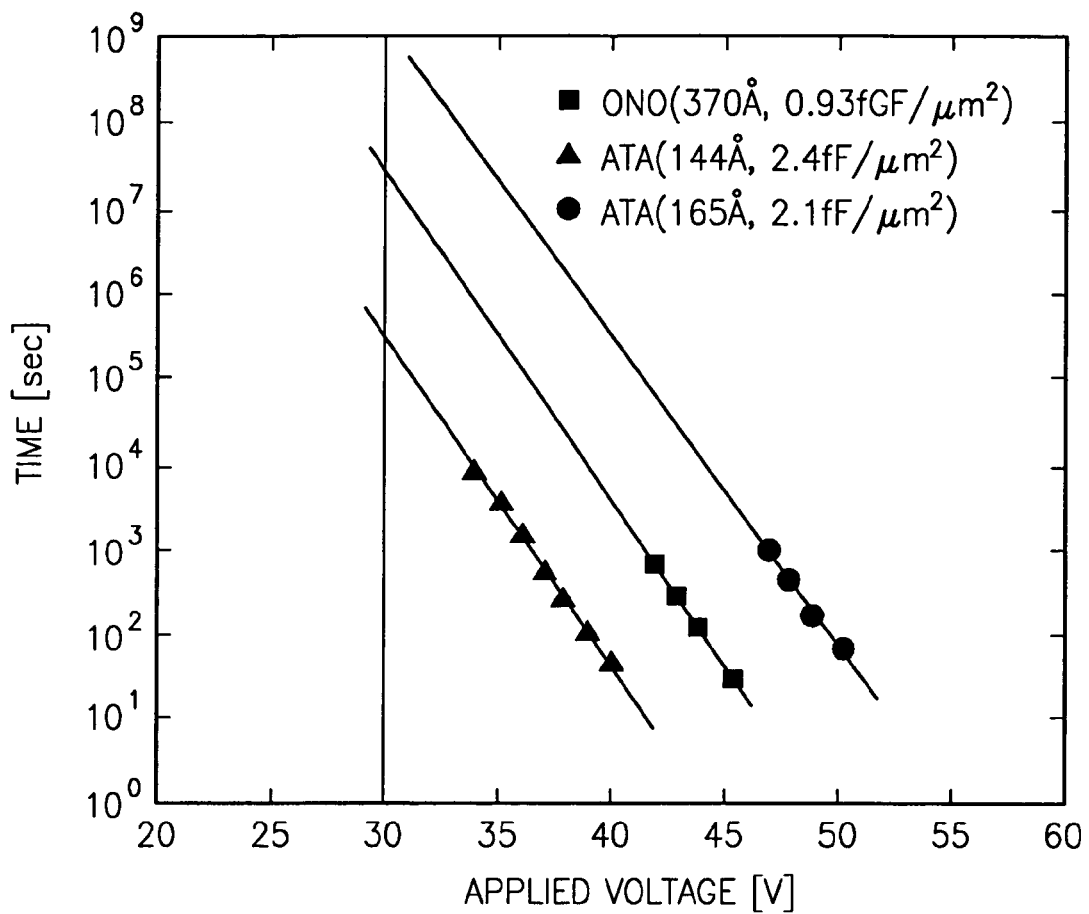
FIG. 6 is a graph showing time dependent dielectric breakdown (TDDB) results of the capacitor including the AlO/TaO/AlO dielectric layer according to the embodiment of the present invention.

FIG. 6 illustrates TDDB results of the capacitor including the ATA layer according to the embodiment of the present invention. Thicknesses of 370 Å, 144 Å, and 165 Å in FIG. 6 represent equivalent oxide thicknesses. Referring to FIG. 6, a capacitor including the ATA layer more than doubles the capacitance per unit area of a capacitor including the ONO layer and is more reliable than the capacitor including the ONO layer under the same voltage level.

FIGS. 7A through 7F are schematic cross-sectional views illustrating a method for manufacturing the capacitor according to the embodiment of the present invention. In this embodiment, a cylinder-type capacitor is formed on a substrate. However, the present invention should not be limited thereto and is applicable to a variety of capacitors irrespective of positions or shapes.

Figure 7A:
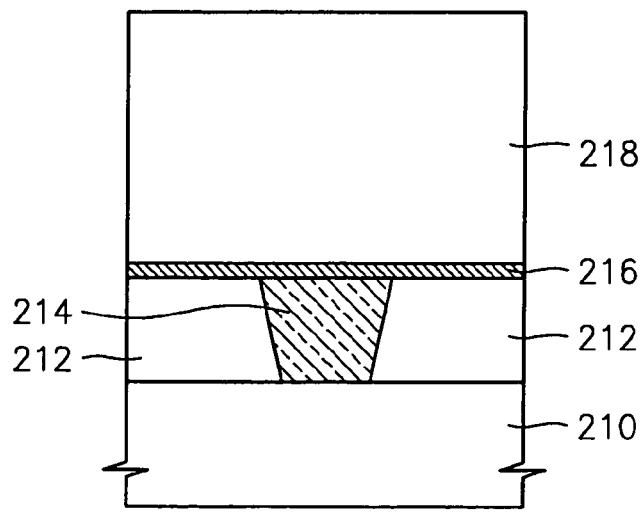
FIGS. 7A through 7F are schematic cross-sectional views illustrating a method for manufacturing the capacitor according to the embodiment of the present invention.

Referring to FIG. 7A, an interlayer dielectric (ILD) 212 is formed of a silicon oxide layer on a substrate 210. A contact plug 214 is formed in the ILD 212 to electrically connect the interlayer dielectric 212 with a capacitor lower electrode. To form a cylinder-type capacitor, an etch stop layer 216 is formed on the ILD 212 including the contact plug 214. The etch stop layer 216 is preferably formed of a material having an etch selectivity with respect to a mold layer 218 to be formed thereon. For example, when the mold layer 218 is formed of a silicon oxide layer, the etch stop layer 216 is typically formed of a silicon nitride layer.

Next, the mold layer 218 is formed on the etch stop layer 216. When the etch stop layer 216 is formed of a silicon nitride layer, the mold layer 218 can be formed of a silicon oxide layer. The mold layer 218 is preferably slightly thicker than the capacitor lower electrode to be formed later.

Figure 7B:
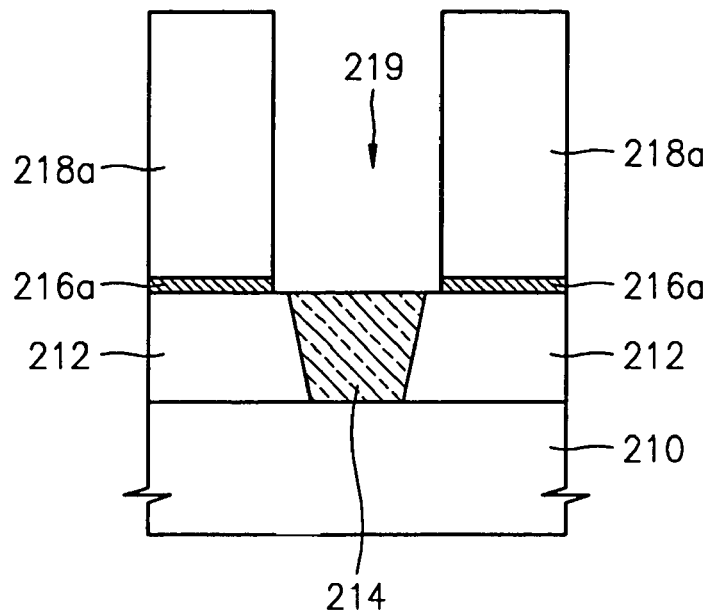

Referring to FIG. 7B, the mold layer 218 is patterned using a photolithographic process to define a capacitor lower electrode region 219. Then, the exposed etch stop layer 216 is removed. As a result, the capacitor lower electrode region 219, which exposes the contact plug 214, is defined by the remaining mold layer 218a and the etch stop layer 216a.

Figure 7C:
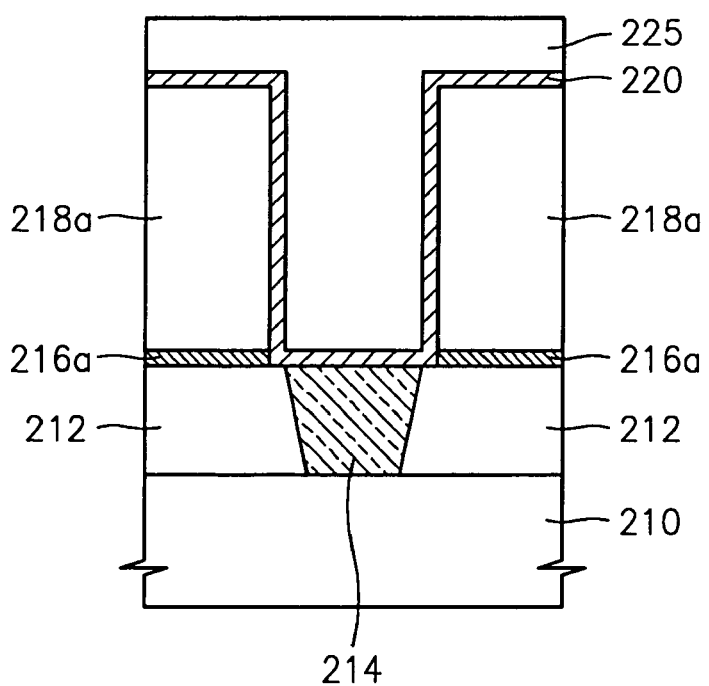

Referring to FIG. 7C, a conductive material layer 220 for forming the capacitor lower electrode is uniformly formed on the capacitor lower electrode region 219 and the mold layer 218a. For instance, the conductive material layer 220 may be formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof.

The conductive material layer 220 can be formed using CVD, PVD, or atomic layer deposition (ALD). In the case where the capacitor lower electrode is formed between metal interconnection layers, the deposition process is preferably carried out within a range of 25 Å to 500 Å. This is because an excessively high process temperature may lower the reliability of the metal interconnections, between which the capacitor is formed. Afterwards, a buffer layer 225, which is a silicon oxide layer like the mold layer 218, is formed on the conductive material layer 220.

Figure 7D:
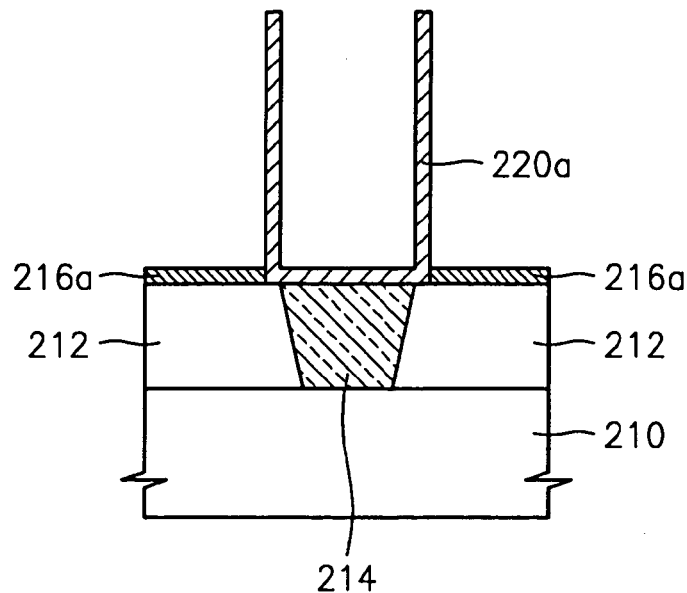

Referring to FIG. 7D, the buffer layer 225 and the conductive material layer 220 are etched using chemical mechanical polishing (CMP) until the mold layer 218a is exposed, thereby separating a node of the conductive material layer 220. Then, the remaining mold layer 218a and buffer layer 225 are removed using a wet etch process. Here, the etch stop layer 216a is used to prevent etching of the ILD 212 thereunder. As a result, as illustrated in FIG. 7D, the cylinder-type capacitor lower electrode 22a is formed.

Figure 7E:
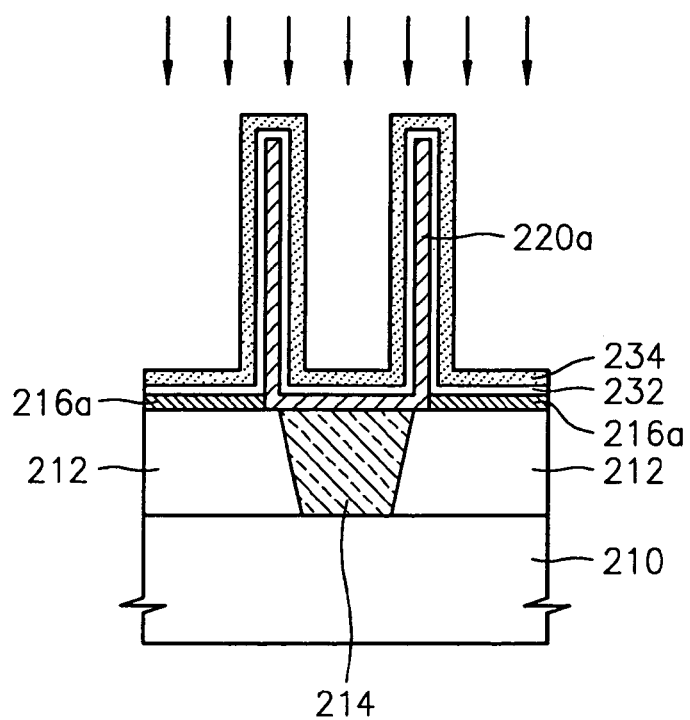

Referring to FIG. 7E, a dielectric layer (230 in FIG. 7F) is formed on inner and outer walls of the capacitor lower electrode 220a. To begin with, an oxide aluminum (AlO) layer 232, i.e., a first dielectric layer, is uniformly formed on the inner and outer walls of the capacitor lower electrode 220a. The first dielectric layer or the AlO layer 232 is preferably formed using ALD. However, a CVD process may be employed.

The ALD process is preferably performed at a temperature of about 250° C. to 500° C. A source gas can be tetra methyl aluminum (TMA) and a reactant gas can be an O2-based source. The reactant gas preferably includes one of $H_2O$, $O_3$, and $O_2$ plasma. The first dielectric layer 232 is formed to a thickness of about 30 Å to about 300 Å. Preferably, $O_3$, or $O_2$ plasma, which are both $O_2$-based sources without hydrogen ions, is used as the reactant gas and the ALD process is carried out at about 30° C. to about 450° C.

Figure 8:
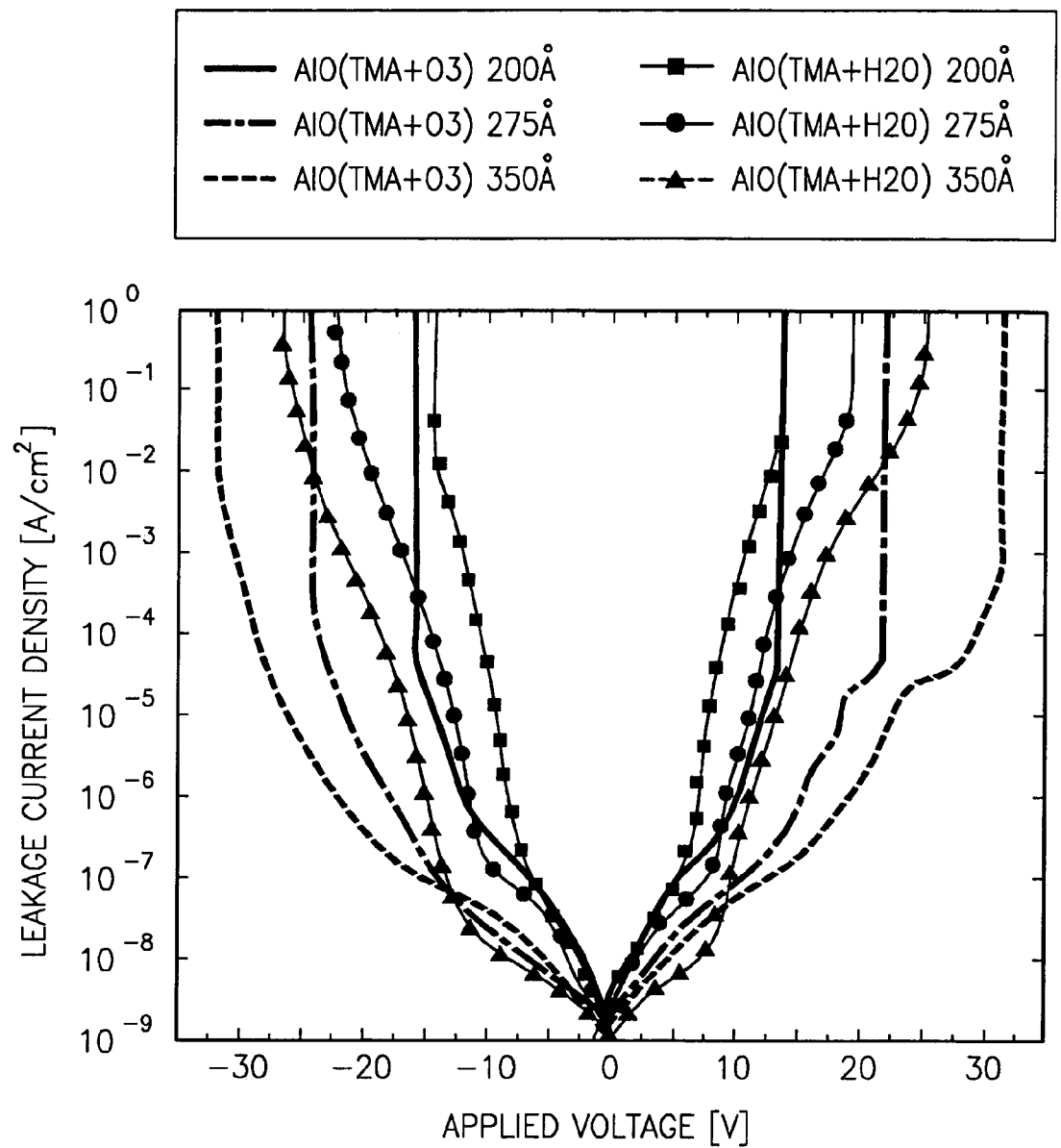
FIG. 8 is a graph showing comparison results of the leakage current density depending on whether or not a reactant gas contains H-radicals when the AlO layer is deposited using ALD.
Figure 9:
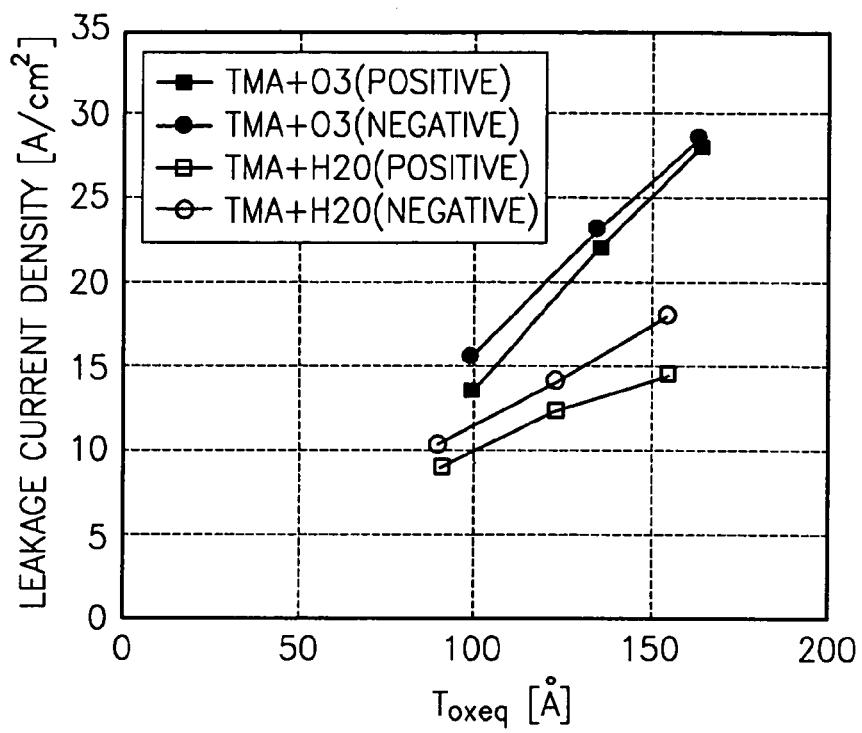
FIG. 9 is a graph showing comparison results of breakdown voltages having a leakage current of 10 nA depending on whether or not the reactant gas contains H-radicals when the AlO layer is deposited using ALD.
Figure 10:
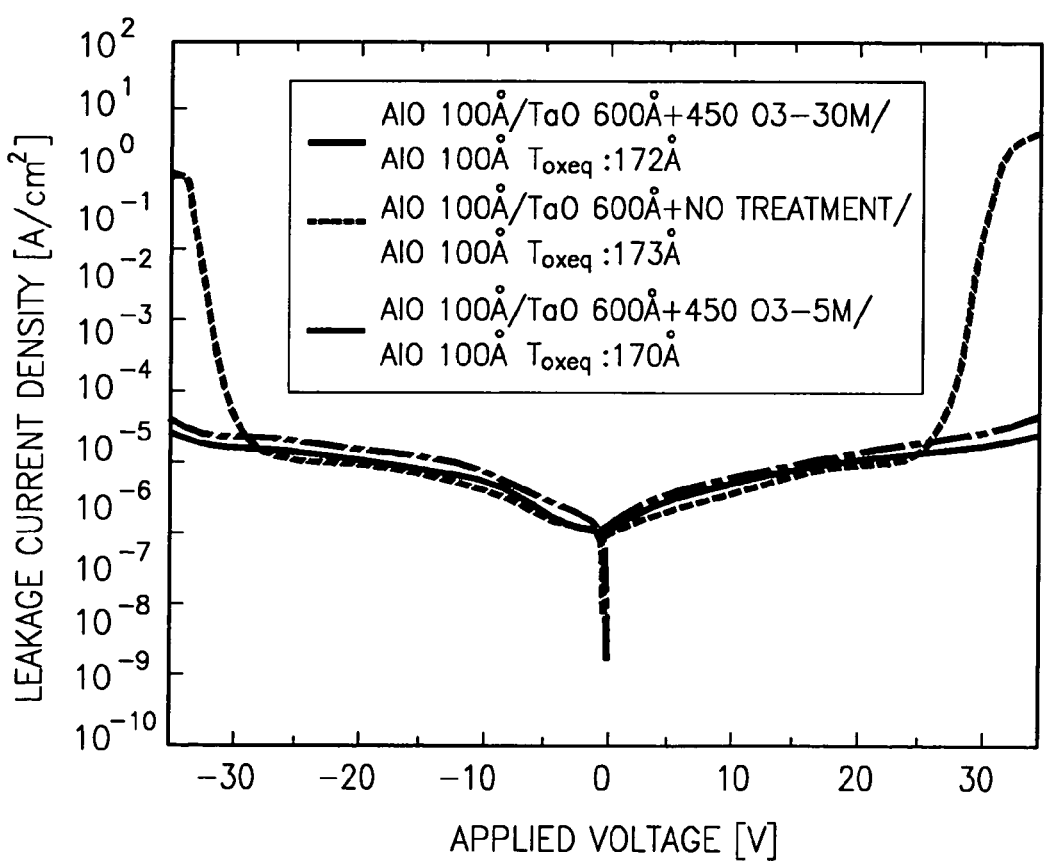
FIG. 10 is graph showing comparison results of the leakage current density depending on whether or not a subsequent thermal treatment is conducted after depositing the TaO layer is deposited using CVD.

FIGS. 8 and 9 illustrate dielectric properties depending on whether or not a reactant gas contains H-radicals when the AlO layer is deposited using ALD. In the embodiment, upper and lower electrodes are formed of TiN using sputtering at about 200° C. The thickness of the AlO layer in FIGS. 8 and 9 does not represent the oxide thickness but the substantial thickness. The TMA source gas is commonly used irrespective of whether or not the reactant gas contains H-radicals.

As illustrated in FIGS. 8 and 9, when the reactant gas includes $H_2O$, the leakage current characteristic is poorer with the same thickness. This is because when the reactant gas includes $H_2O$, OH-radicals, which enter the AlO layer during the formation thereof, deteriorate the leakage current characteristic of the AlO layer.

Afterwards, a second dielectric layer 234 is formed on the first dielectric layer 232. The second dielectric layer 234 is preferably formed of a material that may cause a great amount of leakage current but should have a high dielectric constant. Thus, even if such a material is formed to a thick thickness, its equivalent oxide thickness can vary within a small range. Accordingly, the second dielectric layer 234 is preferably formed of a material having a dielectric constant of 20 or higher. For example, the second dielectric layer 234 may be formed of one selected from the group consisting of a $Ta_2O_5$ layer, a Ti-doped $Ta_2O_5$ layer, a $TaO_xN_y$ layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$(BST) layer, a $PbTiO_3$ layer, a Pb(Zr, Ti)$O_3$(PZT) layer, a $SrBi_2Ta_2O_9$(SBT) layer, (Pb, La)(Zr, Ti)$O_3$ layer, and a $BaTiO_3$(BTO) layer, and any combination thereof.

The second dielectric layer 234 can be formed using ALD or CVD. For example, when the second dielectric layer 234 is formed of TaO using ALD, the process temperature can range from about 250° C. to about 500° C. Also, like the AlO layer, an $O_2$-based reactant source may include one of $H_2O$, $O_3$, and $O_2$ plasma. The thickness of the second dielectric layer 234 can range from about 100 Å to about 1000 Å. When the TaO layer is formed using CVD, the $O_2$-based reactant source may include one of $H_2O$, $O_3$, and $O_2$ plasma and the deposition process is preferably performed at a temperature of about 350° C. to about 500° C.

Under the foregoing process conditions, it is possible to obtain a TaON layer by using an $N_2$-based reactant gas such as $N_2O$ and $NH_3$.

The process conditions for forming a Ti-doped TaO layer are similar to those described above except that the source gas includes Ti instead of Ta, or a mix gas of a Ti-based gas and a Ta-based gas.

After the second dielectric layer 234 is formed of TaO using CVD, a thermal treatment is further carried out. In FIG. 7E, the thermal treatment is illustrated as arrows.

Figure 7F:
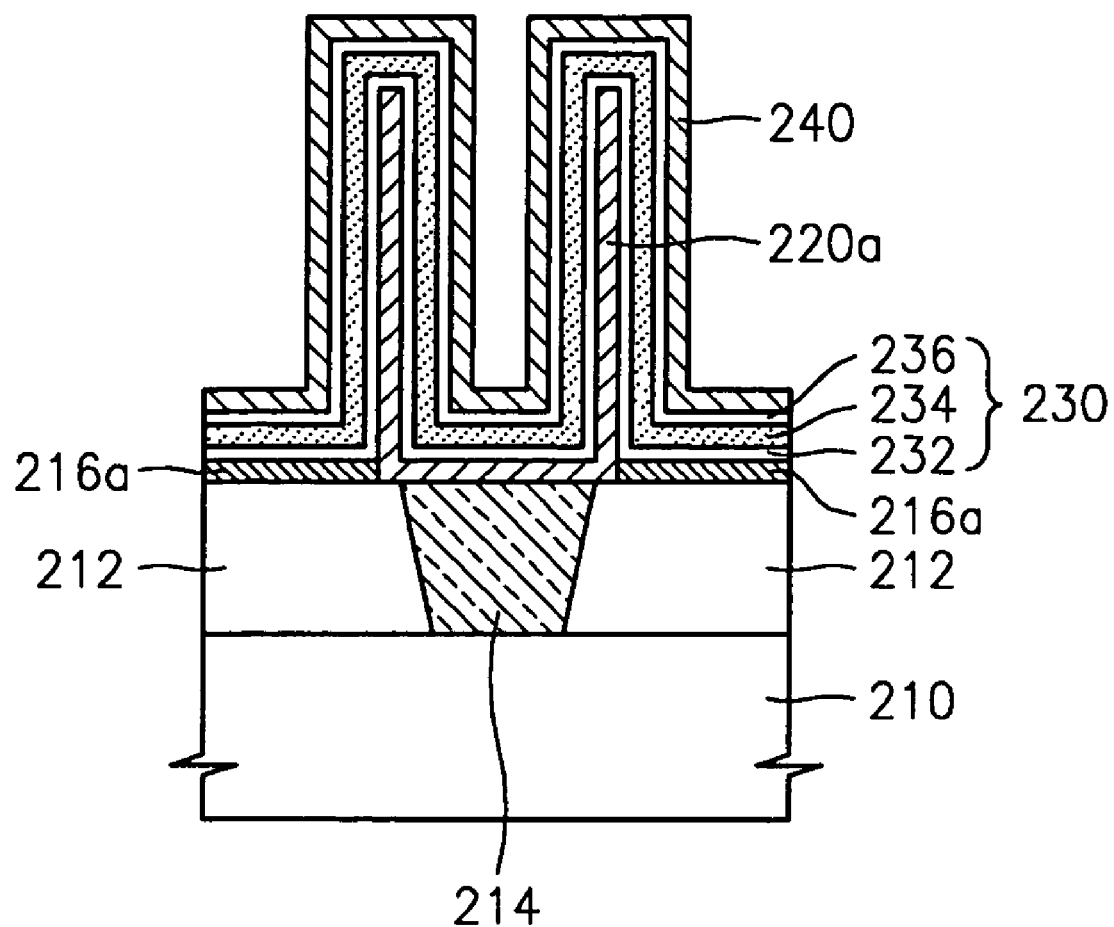

Referring to FIG. 7F, a third dielectric layer 236 is formed of AlO on the second dielectric layer 234. The third dielectric layer 236 can be formed using the same method under the same process conditions as the first dielectric layer 232.

Next, an upper capacitor electrode 240 is formed on the third dielectric layer 236. Like the lower electrode, the upper capacitor electrode 240 may be formed of one selected from the group consisting of a $Ta_2O_5$ layer, a Ti-doped $Ta_2O_5$ layer, a $TaO_xN_y$ layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$ (BST) layer, a $PbTiO_3$ layer, a Pb(Zr, Ti)$O_3$(PZT) layer, a $SrBi_2Ta_2O_9$(SBT) layer, (Pb, La)(Zr, Ti)$O_3$ layer, and a $BaTiO_3$(BTO) layer, and any combination thereof. The third dielectric layer 236 is preferably formed using ALD, CVD, or PVD at about 25° C. to about 500° C.

In the present invention, the dielectric layer 230, which can be, for example, an ATA layer, is preferably formed in-situ. Thus, it is preferable to use a clustered apparatus including a chamber for forming the AlO layer and a chamber for forming a high k-dielectric layer such as TaO layer in order to support the in-situ process.

According to the present invention, a capacitor having large capacitance per unit area can be manufactured. Since a boosting frequency can be lowered, power dissipation can be reduced, thereby enabling the manufacture of a low power device. In addition, this enables the manufacture of a smaller capacitor having the same capacitance. Thus, the chip size can be reduced to achieve high integration.

Further, the capacitor of the present invention exhibits a higher breakdown voltage than the conventional capacitor and improves electrical properties such as the leakage current characteristic and reliability.

While the present invention has been particularly shown and described with reference to a method for manufacturing a cylinder-type capacitor, this invention should not be construed as being limited thereto. Rather, various changes in form and details may be made to a basic structure of a capacitor including a dielectric layer of an AlO/second dielectric/AlO layer between upper and lower electrodes, without departing from the spirit and scope of the present invention as defined by the following claims.

What is claimed is:

1. A method for manufacturing a capacitor of a semiconductor device, the method comprising:
   forming a capacitor lower electrode on a semiconductor substrate;
   forming a multi-layer structure over the capacitor lower electrode, wherein forming the multi-layer structure comprises:
      forming a first dielectric layer comprising aluminum oxide on the capacitor lower electrode by atomic layer deposition (ALD) using an $O_2$ plasma;
      forming a second dielectric layer comprising a material having a higher dielectric constant than aluminum oxide on the first dielectric layer by ALD using the $O_2$ plasma;
      forming a third dielectric layer comprising aluminum oxide on the second dielectric layer by ALD using the $O_2$ plasma; and
   forming a capacitor upper electrode on the third dielectric layer.

2. The method of claim 1, wherein the second dielectric layer is formed of a material having a dielectric constant of 20 or higher.

3. The method as claim in claim 1, wherein the second dielectric layer is formed of one selected from the group consisting of a $Ta_2O_5$ layer, a Ti-doped $Ta_2O_5$ layer, a $TaO_xN_y$ layer, a $HfO_2$ layer, a $ZrO_2$ layer, a $Pr_2O_3$ layer, a $La_2O_3$ layer, a $SrTiO_3$(STO) layer, a (Ba, Sr)$TiO_3$(BST) layer, a $PbTiO_3$ layer, a Pb(Zr, Ti)$O_3$(PZT) layer, a $SrBi_2Ta_2O_9$(SBT) layer, (Pb, La)(Zr, Ti)$O_3$ layer, and a $BaTiO_3$(BTO) layer, and any combination thereof.

4. The method of claim 1, wherein the second dielectric layer is formed to be thicker than the first dielectric layer or the third dielectric layer.

5. The method of claim 1, wherein the second dielectric layer is formed to a thickness of about 100 Å to about 1000 Å.

6. The method of claim 1, further comprising performing a thermal treatment on the second dielectric layer after forming the second dielectric layer.

7. The method of claim 6, wherein the thermal treatment is carried out in an atmosphere containing oxygen.

8. The method of claim 7, wherein the thermal treatment is carried out in an atmosphere of $O_3$ gas, $O_2$ plasma gas, or $N_2O$ plasma gas.

9. The method of claim 7, wherein the thermal treatment is carried out at a temperature of about 300° C. to about 500° C.

10. The method of claim 1, wherein the first dielectric layer or the third dielectric layer is formed to a thickness of about 30 Å to about 300 Å.

11. The method of claim 1, wherein the first dielectric layer or the third dielectric layer is formed using a gas containing oxygen without hydrogen as a reactant gas.

12. The method as claim in claim 1, wherein the capacitor lower electrode or the capacitor upper electrode is formed of one selected from the group consisting of a doped polysilicon, a metal such as W, Pt, Ru, and Ir, a conductive metal nitride such as TiN, TaN, and WN, and a conductive metal oxide such as $RuO_2$ and $IrO_2$, and any combination thereof.

13. The method of claim 12, wherein the capacitor lower electrode or the capacitor upper electrode is formed at a temperature of about 25 to about 500° C.

14. The method of claim 1, wherein the capacitor lower electrode or the capacitor upper electrode is formed using physical vapor deposition, atomic layer deposition, or metal organic chemical vapor deposition.